(12) United States Patent
Bian et al.

(10) Patent No.: US 10,649,140 B1
(45) Date of Patent: May 12, 2020

(54) BACK-END-OF-LINE BLOCKING STRUCTURES ARRANGED OVER A WAVEGUIDE CORE

(71) Applicant: GLOBALFOUNDRIES Inc., Grand Cayman (KY)

(72) Inventors: Yusheng Bian, Ballston Lake, NY (US); Ajey Poovannummoottil Jacob, Watervliet, NY (US); Abu Thomas, Brookline, MA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/291,671

(22) Filed: Mar. 4, 2019

(51) Int. Cl.
| | |
|---|---|
| *G02B 6/12* | (2006.01) |
| *G02B 6/122* | (2006.01) |
| *G02B 6/13* | (2006.01) |
| *H01L 23/528* | (2006.01) |
| *H01L 23/532* | (2006.01) |
| *H01L 23/522* | (2006.01) |
| *H01L 21/768* | (2006.01) |
| *H01L 21/311* | (2006.01) |
| *H01L 21/3105* | (2006.01) |
| *H01L 21/02* | (2006.01) |

(52) U.S. Cl.
CPC ............ *G02B 6/1228* (2013.01); *G02B 6/13* (2013.01); *H01L 21/76802* (2013.01); *H01L 21/76834* (2013.01); *H01L 21/76877* (2013.01); *H01L 23/528* (2013.01); *H01L 23/5226* (2013.01); *H01L 23/5329* (2013.01); *G02B 2006/12147* (2013.01); *H01L 21/02167* (2013.01); *H01L 21/02271* (2013.01); *H01L 21/31053* (2013.01); *H01L 21/31111* (2013.01); *H01L 21/76843* (2013.01)

(58) Field of Classification Search
None
See application file for complete search history.

(56) References Cited

U.S. PATENT DOCUMENTS

| | | | |
|---|---|---|---|
| 4,432,601 A | 2/1984 | Mannschke | |
| 6,014,481 A | 1/2000 | Kremers | |
| 9,715,064 B1* | 7/2017 | Gambino | ............... G02B 6/124 |

(Continued)

FOREIGN PATENT DOCUMENTS

EP 0542121 A1 5/1993

OTHER PUBLICATIONS

Chien et al., "Dual wavelength demultiplexing by coupling and decoupling of photonic crystal waveguides", (c) 2004 Optical Society of America.

(Continued)

*Primary Examiner* — Michael Stahl
(74) *Attorney, Agent, or Firm* — Thompson Hine LLP; Francois Pagette

(57) ABSTRACT

Structures including a waveguide core and methods of fabricating a structure including a waveguide core. A back-end-of-line interconnect structure includes a cap layer, an interlayer dielectric layer, and one or more metal features embedded in the interlayer dielectric layer. The interlayer dielectric layer is stacked in a vertical direction with the cap layer. The one or more metal features have an overlapping arrangement in a lateral direction with the waveguide core, which is arranged under the back-end-of-line interconnect structure.

19 Claims, 9 Drawing Sheets

(56) References Cited

U.S. PATENT DOCUMENTS

| | | | |
|---|---|---|---|
| 2014/0321802 A1* | 10/2014 | Ellis-Monaghan | ........................ G02B 6/4214 385/14 |
| 2015/0097257 A1* | 4/2015 | Gambino | ............... G02B 6/122 257/432 |
| 2015/0198775 A1* | 7/2015 | Sandhu | ............... H01L 27/0617 385/14 |
| 2016/0105247 A1* | 4/2016 | Cheng | ................... H01L 31/173 250/551 |
| 2016/0334573 A1* | 11/2016 | Kunishima | ....... H01L 23/53214 |
| 2016/0370542 A1* | 12/2016 | Usami | ...................... G02B 6/13 |
| 2016/0377892 A1* | 12/2016 | Jou | ........................ G02F 1/011 385/3 |
| 2017/0031094 A1* | 2/2017 | Nakashiba | ............. G02B 6/122 |
| 2017/0054039 A1* | 2/2017 | Gong | ................ H01L 21/76802 |
| 2018/0128974 A1* | 5/2018 | Iida | ........................ G02B 6/122 |
| 2018/0372950 A1* | 12/2018 | Usami | ...................... G02B 6/12 |

OTHER PUBLICATIONS

Boscolo et al., "Coupling and Decoupling of Electromagnetic Waves in Parallel 2-D Photonic Crystal Waveguides", IEEE Journal of Quantum Electronics, vol. 38, No. 1, Jan. 2002.

Koponen et al., "Conditions for waveguide decoupling in square-lattice photonic crystals", Journal of Applied Physics 96, 4039 (2004).

\* cited by examiner

BACK-END-OF-LINE BLOCKING STRUCTURES ARRANGED OVER A WAVEGUIDE CORE

BACKGROUND

The present invention relates to photonics chips and, more specifically, to structures including a waveguide core and methods of fabricating a structure including a waveguide core.

Photonics chips are used in many applications and systems including, but not limited to, data communication systems and data computation systems. A photonics chip integrates optical components, such as waveguides, optical switches, and bends, and electronic components, such as field-effect transistors, into a unified platform. Among other factors, layout area, cost, and operational overhead may be reduced by the integration of both types of components into a photonics chip.

A back-end-of-line (BEOL) interconnect structure may be used to electrically couple device structures fabricated on a substrate during front-end-of-line (FEOL) processing. Photonic modes in narrow waveguides can couple with the radiation modes supported by dielectric layers in the BEOL interconnect structure. The coupling, which may be induced by modal index matching between the narrow waveguide and the BEOL dielectric layers, can dramatically degrade waveguide performance. Silicon nitride waveguides are characterized by smaller effective refractive indices and weaker mode confinement than single-crystal silicon waveguides. Consequently, the unwanted coupling with the BEOL dielectric layers may be especially problematic in connection with narrow silicon nitride waveguides, such as tapered sections of silicon nitride waveguides.

Improved structures including a waveguide core and methods of fabricating a structure including a waveguide core are needed.

SUMMARY

In an embodiment of the invention, a structure includes a waveguide core and a back-end-of-line interconnect structure having a cap layer, an interlayer dielectric layer, and one or more metal features embedded in the interlayer dielectric layer. The interlayer dielectric layer is stacked in a vertical direction with the cap layer. The one or more metal features have an overlapping arrangement in a lateral direction with the waveguide core.

In an embodiment of the invention, a method includes patterning a dielectric layer to form a waveguide core, depositing an interlayer dielectric layer of a back-end-of-line interconnect structure over the waveguide core, forming one or more metal features embedded in the interlayer dielectric layer, and depositing a cap layer that is stacked in a vertical direction in the back-end-of-line interconnect structure with the interlayer dielectric layer. The one or more metal features have an overlapping arrangement in a lateral direction with the waveguide core.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
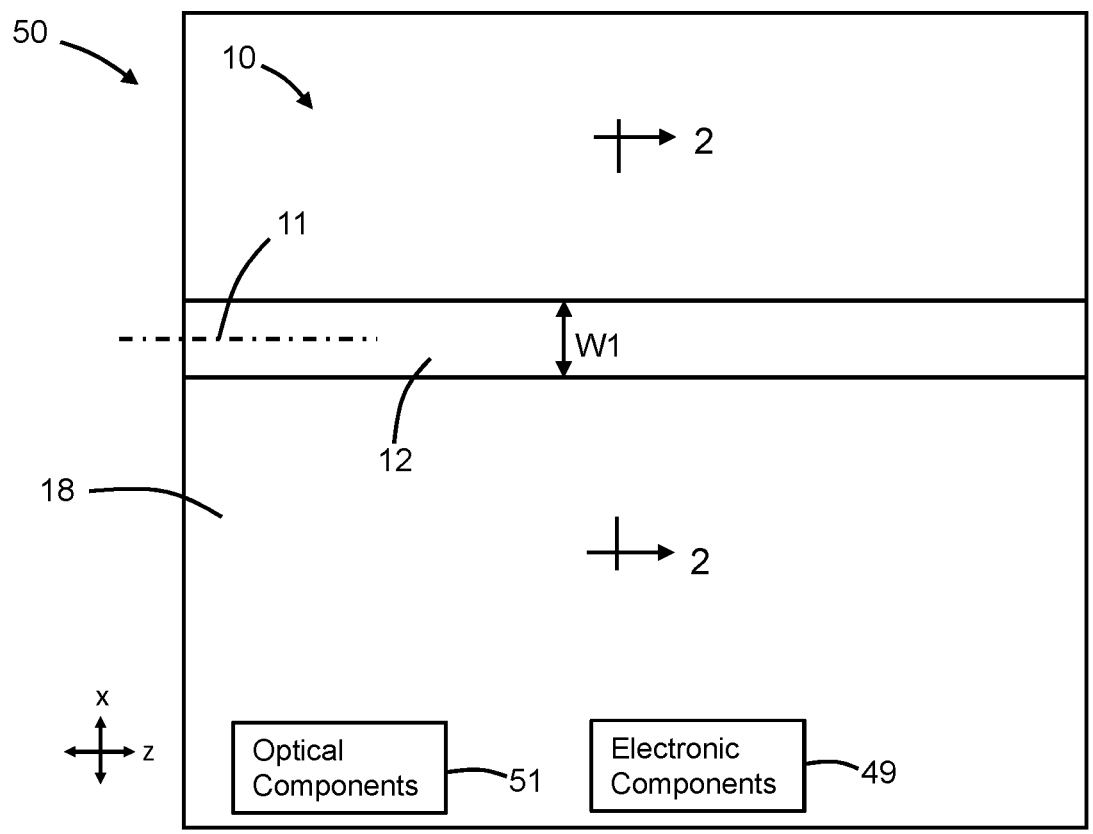
FIG. 1 is a top view of a photonics chip including a structure at an initial fabrication stage of a processing method in accordance with embodiments of the invention.
Figure 2:
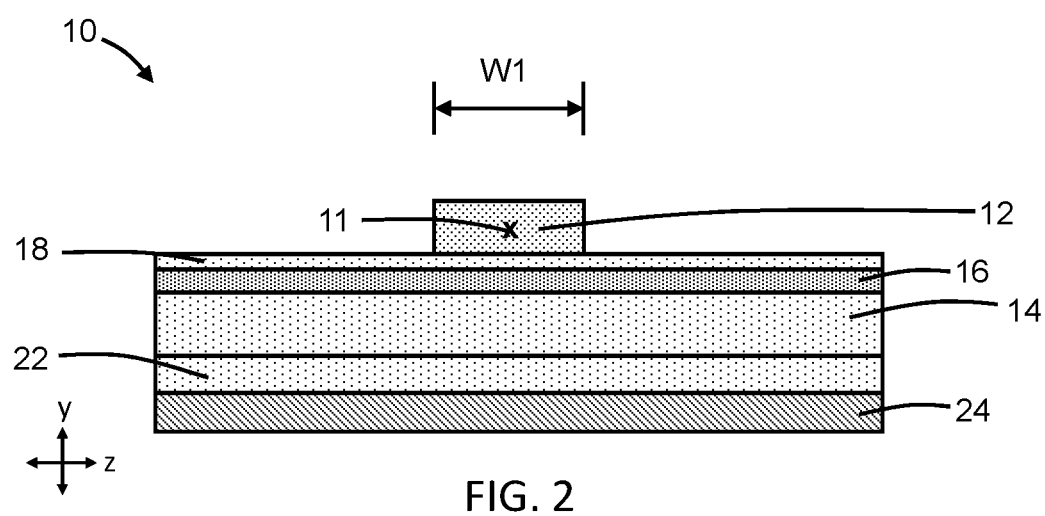
FIG. 2 is a cross-sectional view of the structure taken generally along line 2-2 in FIG. 1 or along line 2-2 in FIG. 1A.

With reference to FIGS. 1, 2 and in accordance with embodiments of the invention, a structure 10 includes a waveguide core 12 and a set of dielectric layers 14, 16, 18 arranged under the waveguide core 12. The dielectric layer 16 is arranged over the dielectric layer 14, the dielectric layer 18 is arranged over the dielectric layer 16, and the waveguide core 12 is arranged over the dielectric layer 18. The dielectric layers 14, 16, 18, which may be formed before forming the waveguide core 12 and are arranged in the vertical direction (i.e., the y-direction) below the waveguide core 12, are composed of respective dielectric materials that are sequentially formed in a multiple layer stack.

The dielectric layer 14 may be composed of a dielectric material, such as silicon dioxide, deposited by chemical vapor deposition and planarized with, for example, chemical mechanical polishing (CMP). The dielectric layer 16 may be composed of dielectric material, such as silicon dioxide, deposited by chemical vapor deposition or atomic layer deposition over the dielectric layer 14. The dielectric layer 18 may be composed of dielectric material, such as silicon nitride, deposited by chemical vapor deposition or atomic layer deposition over the dielectric layer 16.

Figure 1A:
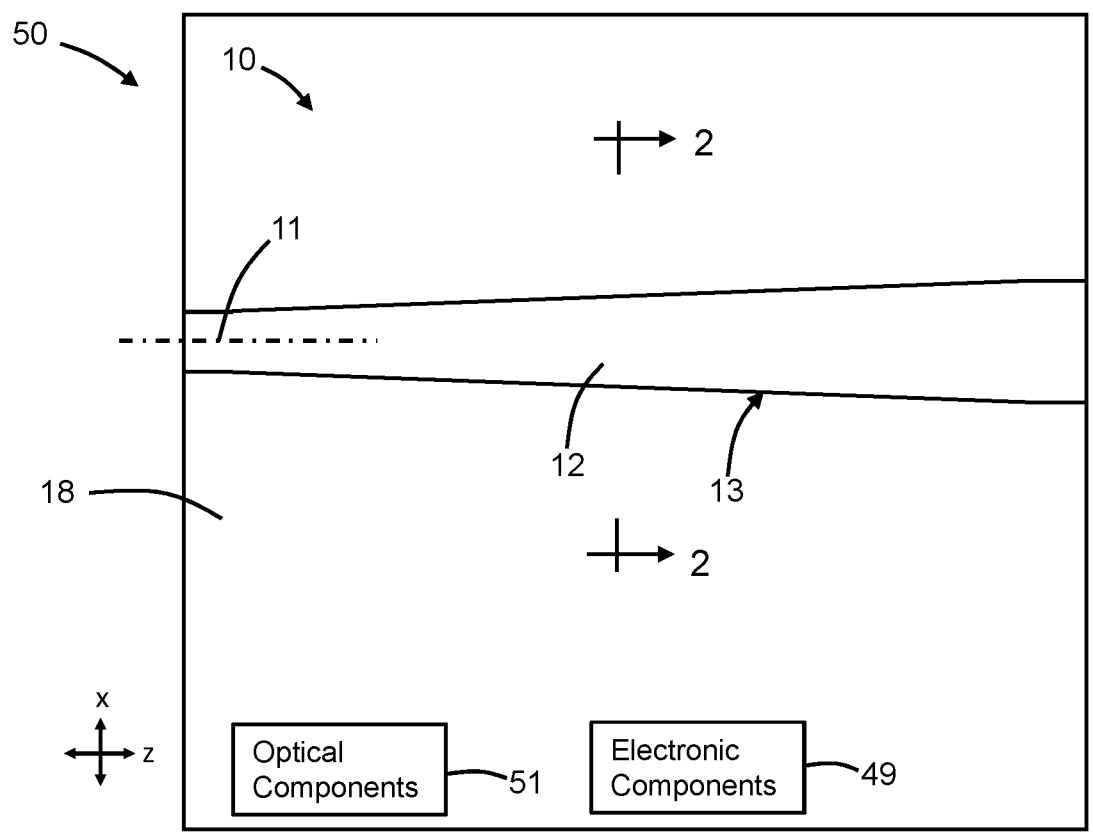
FIG. 1A is a top view of a photonics chip including a structure at an initial fabrication stage of a processing method in accordance with alternative embodiments of the invention.

The waveguide core 12 may be formed from a layer composed of a material that is deposited and patterned with lithography and etching processes. In an embodiment, the waveguide core 12 may be composed of a dielectric material, such as silicon nitride. The deposited layer may be fully etched during patterning to form the waveguide core 12 as shown or, alternatively, the deposited layer may be partially etched during patterning to define a ridge waveguide. The waveguide core 12 has a width, W1, in a lengthwise direction along a longitudinal axis 11. The waveguide core 12 may include a taper 13 (FIG. 1A) that connects adjacent straight sections of different width and that provides a transition between the different straight sections.

The waveguide core 12 and the dielectric layers 14, 16, 18 may be arranged over a buried insulator layer 22 and a substrate 24 of a silicon-on-insulator (SOI) wafer with the dielectric layer 14 deposited on the buried insulator layer 22. The buried insulator layer 22 may be composed of a dielectric material, such as silicon dioxide. The substrate 24 may be composed of a single-crystal semiconductor material, such as single-crystal silicon, and the substrate 24 is arranged under the buried insulator layer 22. The SOI wafer further includes a device layer (not shown) that may be composed of a single-crystal semiconductor material, such as single-crystal silicon, and that has been locally removed in the vicinity of the waveguide core 12 by lithography and etching processes during front-end-of-line processing.

Figure 3:
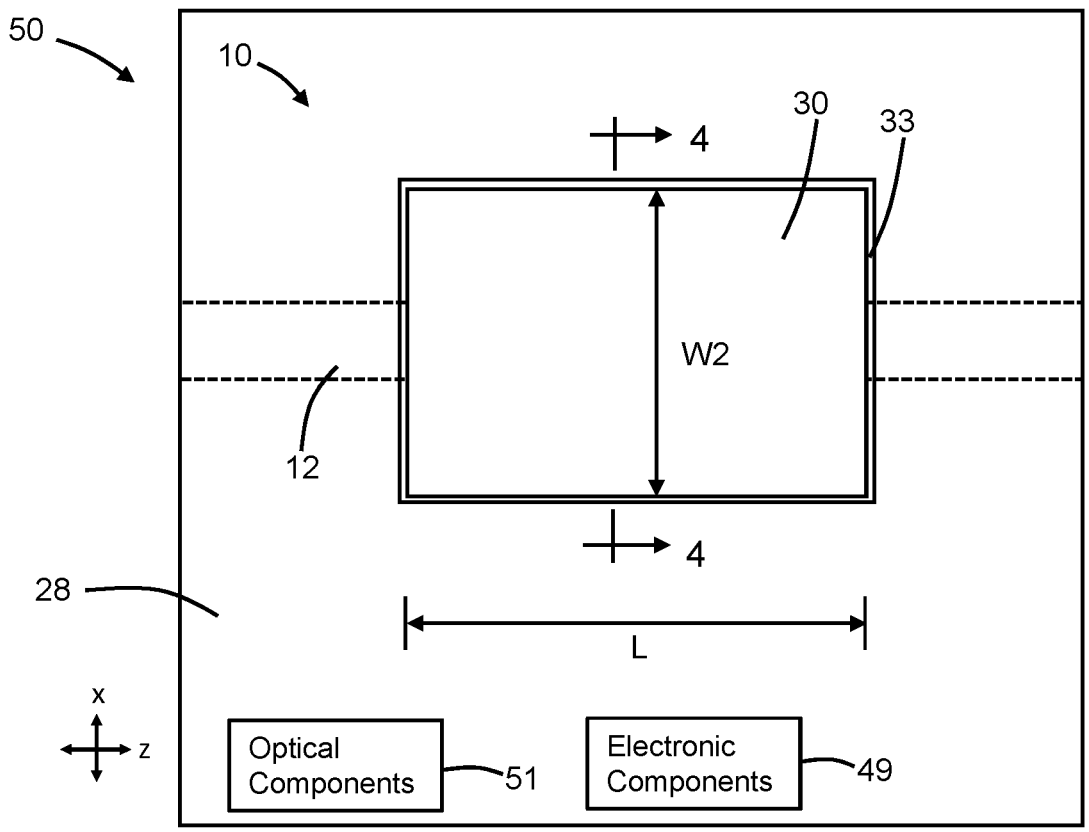
FIG. 3 is a top view of the structure of FIG. 1 at a fabrication stage subsequent to FIG. 2.
Figure 4:
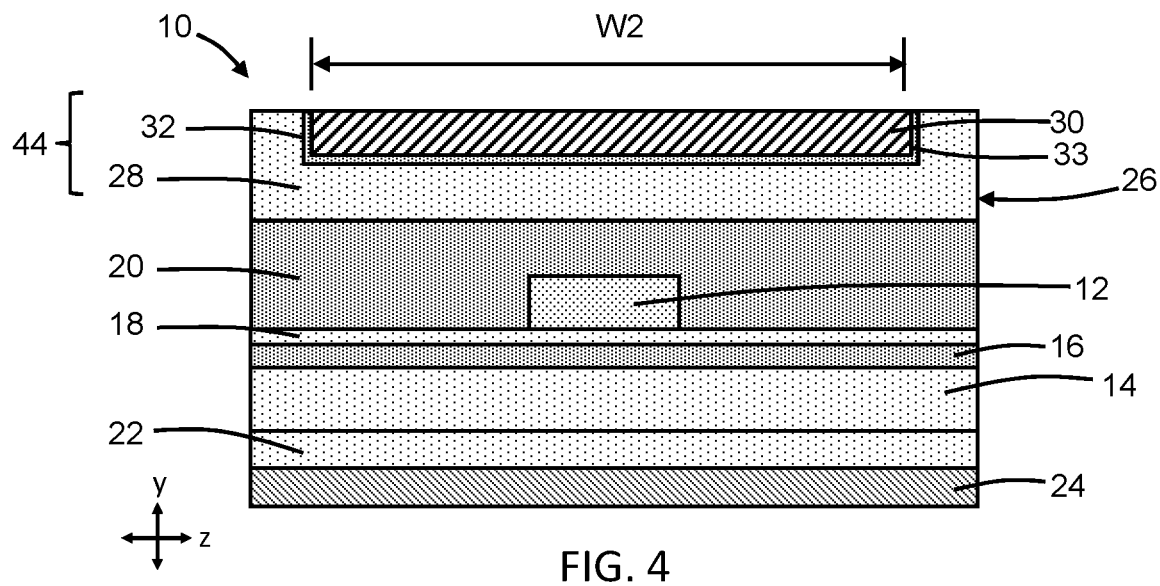
FIG. 4 is a cross-sectional view of the structure taken generally along line 4-4 in FIG. 3.

With reference to FIGS. 3, 4 in which like reference numerals refer to like features in FIG. 1 and at a subsequent fabrication stage, a dielectric layer 20 is formed by middle-of-line processing over the waveguide core 12 and the dielectric layer 16. The thickness of the dielectric layer 20 may be selected such that the waveguide core 12 is embedded or buried in the dielectric material of the dielectric layer 20. The dielectric layer 20 may be composed of dielectric material, such as silicon dioxide, deposited by chemical vapor deposition using ozone and tetraethylorthosilicate (TEOS) as reactants. Contacts (not shown) may be present in the dielectric layer 20 at locations remote from the waveguide core 12.

An interconnect structure, generally indicated by reference numeral 26, is formed by back-end-of-line (BEOL) processing over the waveguide core 12. The interconnect structure 26 may include an interlayer dielectric layer 28 of a metallization level 44 of the interconnect structure 26, and a metal feature 30 that is embedded in the interlayer dielectric layer 28. The metallization level 44 may represent the closest metallization level in the interconnect structure 26 to the waveguide core 12 and substrate 24.

The metal feature 30 may have given dimensions in the exemplary form of a length, L, and width, W2, and may be arranged with an overlapping arrangement over an equal-length section of the waveguide core 12. The width, W1, of the overlapped section of the waveguide core 12 (FIG. 1) may be less than the width, W2, of the metal feature 30. The metal feature 30 has an outer edge or boundary with the given dimensions that surrounds an unbroken region having the form of a continuous sheet or layer.

The interlayer dielectric layer 28 may be composed of an electrical insulator, such as silicon dioxide, a low-k dielectric material, or an ultra-low-k dielectric material, that is deposited by chemical vapor deposition. For example, the interlayer dielectric layer 28 may be composed of carbon-doped silicon oxide. The metal feature 30 may be composed of a conductor, such as copper, cobalt, or aluminum, that is deposited by, for example, electroless deposition using a seed layer.

The metal feature 30 may be a metal line that is formed in a trench 32 that penetrates partially through the interlayer dielectric layer 28. The trench 32 and metal feature 30 may be formed using a damascene process. In the damascene process, the trench 32 is patterned by lithography and etching processes in the interlayer dielectric layer 28, and then filled with deposited metal that is planarized with chemical-mechanical polishing to create the metal feature 30 in the metallization level 44. In an embodiment, the trench 32 used to form the metal feature 30 may lack via openings in the interlayer dielectric layer 28 that are characteristic of dual-damascene processes and that provide vertical connections between metal lines in different metallization levels. In an embodiment, the metal feature 30 is a single metal line that is formed in a single trench 32.

In an alternative embodiment, the metal feature 30 may be formed from a metal layer that is deposited and patterned with lithography and etching processes, instead of being formed using a single or dual damascene process. The interlayer dielectric layer 28 may be deposited over the metal feature 30 and planarized.

A barrier/liner layer 33 may be arranged between the metal feature 30 and the surfaces of the interlayer dielectric layer 28 around the metal feature 30. The barrier/liner layer 33 may be composed of one or more conductive materials, such as titanium nitride, tantalum nitride, tantalum, titanium, tungsten, tungsten nitride, cobalt, ruthenium, or a layered stack of these conductive materials (e.g., a bilayer of titanium and titanium nitride) deposited by, for example, physical vapor deposition or chemical vapor deposition. In an alternative embodiment, the barrier/liner layer 33 may be omitted.

In an alternative embodiment, the metal feature 30 may be arranged over the taper 13 (FIG. 1A) of the waveguide core 12 and have an overlapping arrangement with the taper 13.

The structure 10, in any of its embodiments described herein, may be integrated into a photonics chip 50 (FIGS. 1, 2) that includes electronic components 49 and additional optical components 51. For example, the electronic components 49 may include field-effect transistors that are fabricated by CMOS front-end-of-line (FEOL) processing.

Figure 5:
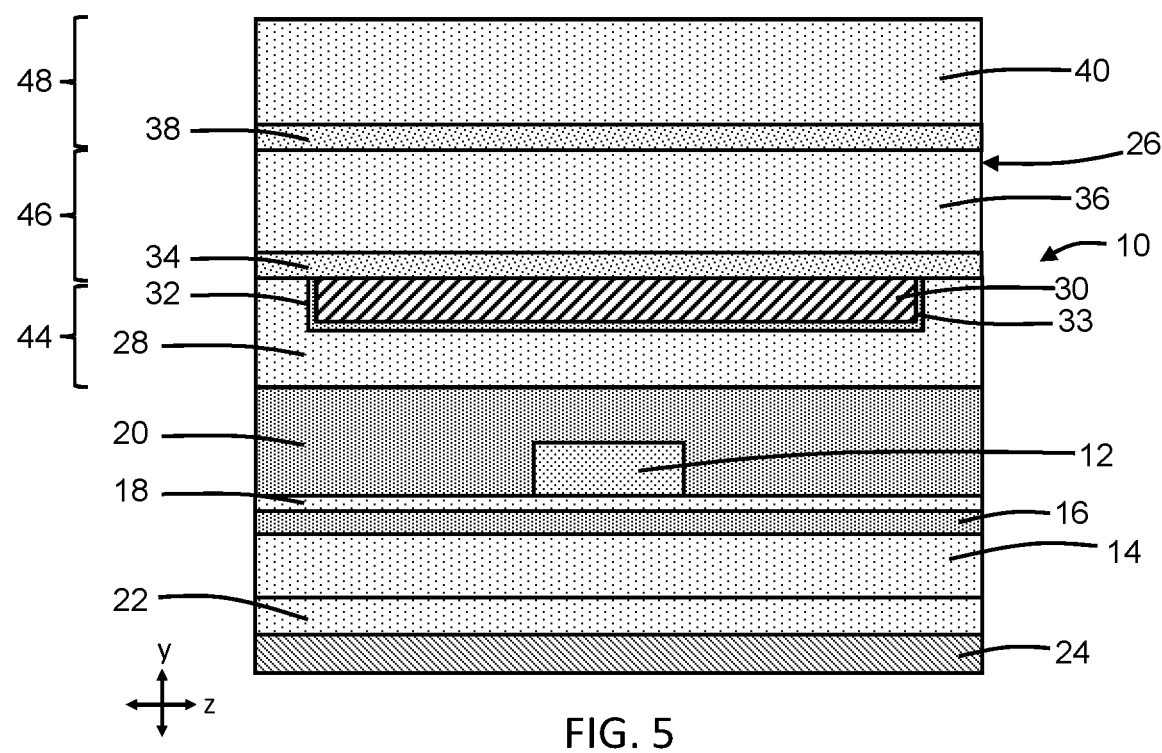
FIG. 5 is a cross-sectional view of the structure at a fabrication stage subsequent to FIG. 4.

With reference to FIG. 5 in which like reference numerals refer to like features in FIG. 4 and at a subsequent fabrication stage, additional metallization levels 46, 48 of the interconnect structure 26 are formed over the metallization level 44 including the interlayer dielectric layer 28 and metal feature 30. The metallization level 46 includes a cap layer 34 and an interlayer dielectric layer 36 are serially formed over the interlayer dielectric layer 28 and metal feature 30. The cap layer 34 is composed of a dielectric material that has a different composition than the dielectric material of the interlayer dielectric layer 36. In an embodiment, the cap layer 34 may be composed of silicon carbon nitride (SiCN) (e.g., nitrogen-doped silicon carbide), commonly known as NBloK, deposited by chemical vapor deposition, and the interlayer dielectric layer 36 may be composed of the same dielectric material as the interlayer dielectric layer 28. In an embodiment, the cap layer 34 may be composed of a different high-index dielectric material, such as silicon nitride, characterized by a refractive index greater than the refractive index of silicon dioxide. The cap layer 34 protects the interlayer dielectric layer 28 and metal feature 30 from the etching and lithography processes used to form via openings and trenches (not shown) in the interlayer dielectric layer 36, as well as acting as a barrier diffusion layer for atomic metal residues on the top surface of the interlayer dielectric layer 28.

The upper metallization level 48 includes a cap layer 38 and an interlayer dielectric layer 40 that are serially formed over the cap layer 34 and interlayer dielectric layer 36 of the lower metallization level 46. The cap layer 38 may be similar in composition to the cap layer 34, the interlayer dielectric layer 40 may be similar in composition to the interlayer dielectric layer 36, and the layers 38, 40 may be formed in the same manner as the layers 34, 36.

The interconnect structure 26 may include additional metallization levels (not shown), each including a cap layer and an interlayer dielectric layer. In an embodiment, the additional metallization levels may be arranged over the metallization level 48. In an embodiment, the additional metallization levels may be arranged below the metallization level 44.

The metal feature 30 is arranged within the interconnect structure 26 in a vertical direction between the waveguide core 12 and both of the cap layers 34, 38. The metal feature 30 operates to mitigate or block coupling between an optical signal propagating with a given mode (e.g., TM mode) in the waveguide core 12 and the cap layer 34 in the metallization level 46 and/or between the waveguide core 12 and the cap layer 38 in the metallization level 48 that would otherwise degrade field confinement. The thicknesses of the cap layers 34, 38 and the width of the waveguide core 12 may determine whether the cap layer 34 or the cap layer 38 has potential coupling that is mitigated or blocked by the metal feature 30. The thickness of the cap layer 34 and the thickness of the cap layer 38 may differ, which result in only one or the other of the cap layers 34, 38 having the capacity for coupling with the waveguide core 12. For example, the cap layer 38 may have a thickness that is approximately one-half of the thickness of the cap layer 34 and, for that reason, may have a different coupling capacity than cap layer 34 with optical signals propagating in the waveguide core 12.

Figure 6:
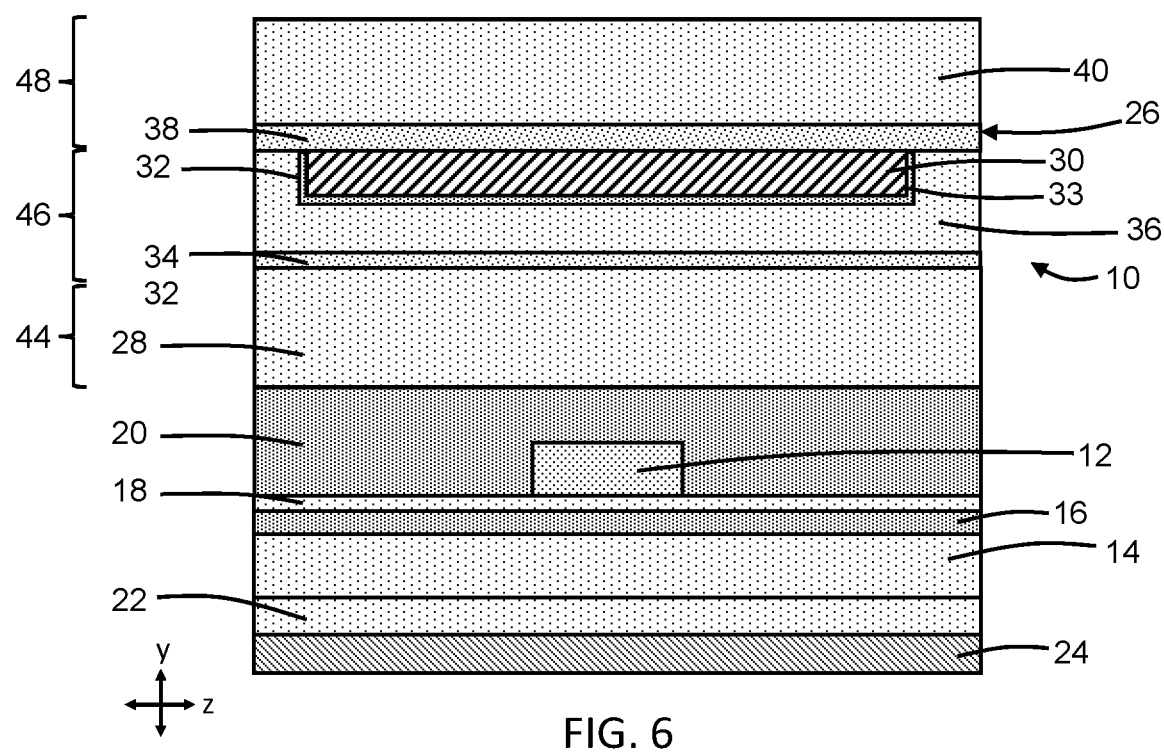
FIGS. 6-9 are cross-sectional views of structures in accordance with alternative embodiments of the invention.

With reference to FIG. 6 in which like reference numerals refer to like features in FIG. 5 and in accordance with alternative embodiments of the invention, the metal feature 30 and trench 32 may be moved upward in the interconnect structure 26 to the metallization level 46 that includes the interlayer dielectric layer 36. The metal feature 30 may be placed in the metallization level 46 to mitigate or block coupling with the cap layer 38 in the metallization level 48. The cap layer 34 in the metallization level 46 is arranged between the metal feature 30 and the waveguide core 12, and the cap layer 34 may have a thickness that does not induce coupling such that its intervening location between the metal feature 30 and the waveguide core 12 is permitted.

Figure 7:
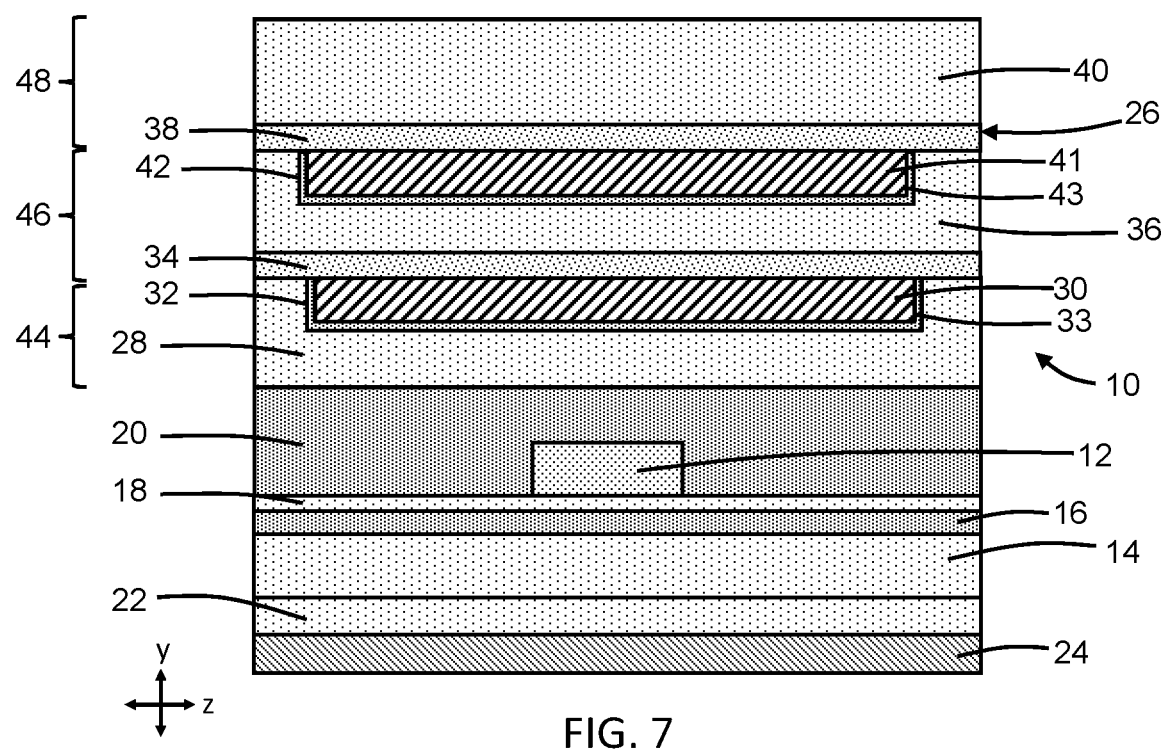

With reference to FIG. 7 in which like reference numerals refer to like features in FIG. 5 and in accordance with alternative embodiments of the invention, a metal feature 41 may be formed in a trench 42 in the interlayer dielectric layer 36 of the metallization level 46. The metal feature 41 and trench 42 may be formed in the same manner as the metal feature 30 and trench 32, and an optional barrier/liner layer 43 may be arranged between the metal feature 41 and the surfaces of the interlayer dielectric layer 36 surrounding the trench 42. The resulting structure includes the metal feature 41 in the metallization level 46 including the interlayer dielectric layer 36, and the metal feature 30 in the metallization level 44 including the interlayer dielectric layer 28 such that multiple metallization levels contain metal features that mitigate or block unwanted coupling.

Figure 8:
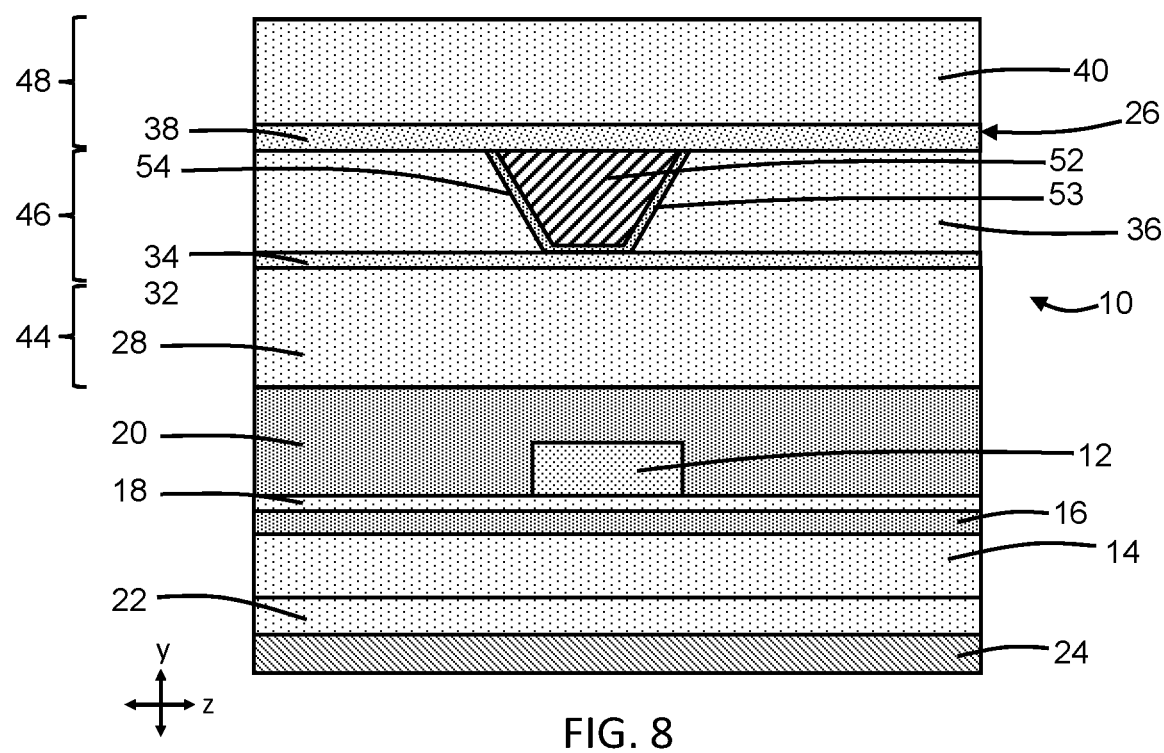

With reference to FIG. 8 in which like reference numerals refer to like features in FIG. 6 and in accordance with alternative embodiments of the invention, the metal feature 30 may be replaced by a metal feature 52 that has the shape of a via and that may be formed in a via opening 54 defined in the interlayer dielectric layer 36 of metallization level 46. An optional barrier/liner layer 53 may be arranged between the metal feature 52 and the surfaces of the interlayer dielectric layer 36 surrounding the opening 54. In an alternative embodiment, the metal feature 52 and via opening 54 may be arranged in the interlayer dielectric layer 28 of metallization level 44. In an alternative embodiment, a metal feature and via opening similar to the metal feature 52 and the via opening 54 may also be present in the metallization level 44.

Figure 9:
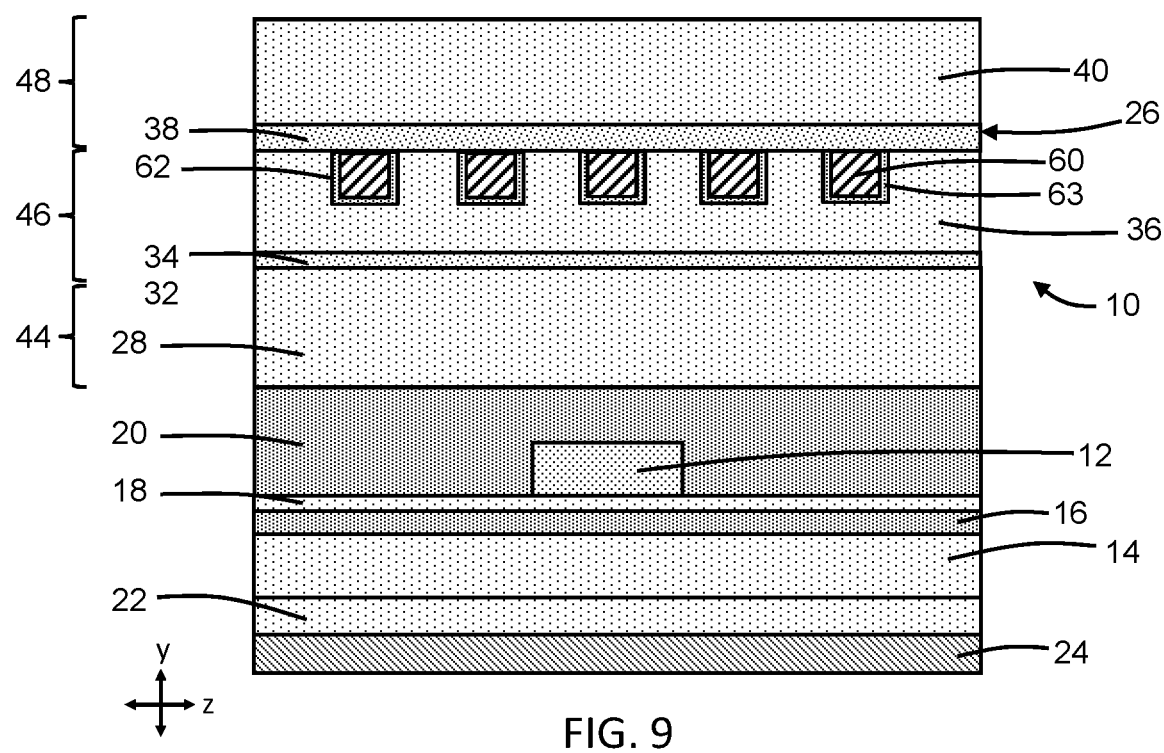

With reference to FIG. 9 in which like reference numerals refer to like features in FIG. 6 and in accordance with alternative embodiments of the invention, the metal feature 30 in metallization level 46 may be replaced by multiple metal features 60 that are arranged in an array. The metal features 60 may be arranged in corresponding openings 62 that penetrate partially through the interlayer dielectric layer 36 and may include a barrier/liner layer 63 analogous to barrier/liner layer 33. In an alternative embodiment, the metal features 60 may be arranged in openings 62 that penetrate fully through the interlayer dielectric layer 36 to the cap layer 34, which operates as an etch stop. The openings 62 may be trenches or, alternatively, may be via openings as shown in FIG. 8.

Figure 9A:
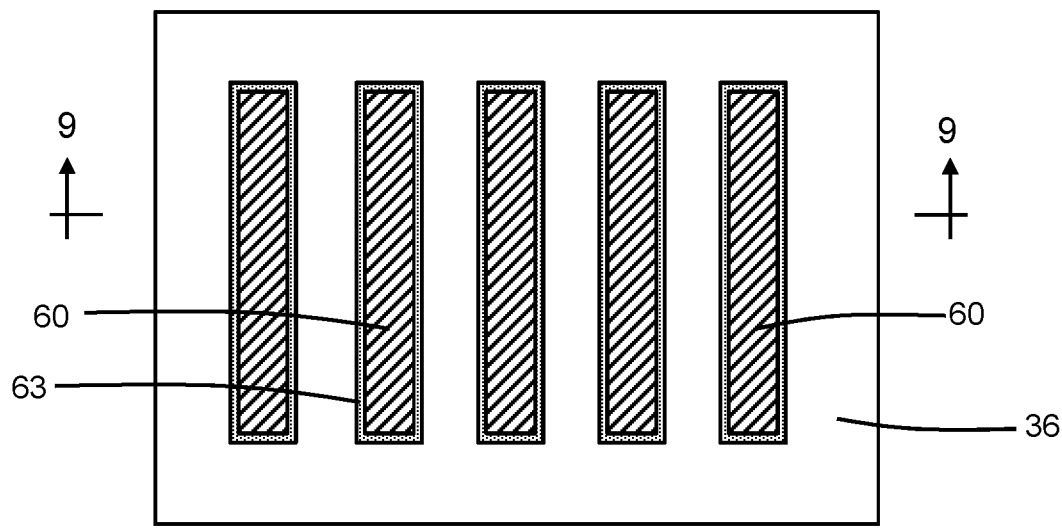
FIG. 9A is a diagrammatic top view of the structure of FIG. 9 in which overlying layers in the interconnect structure are omitted for clarity of description and in which the metal features are arranged in a one-dimensional array.
Figure 9B:
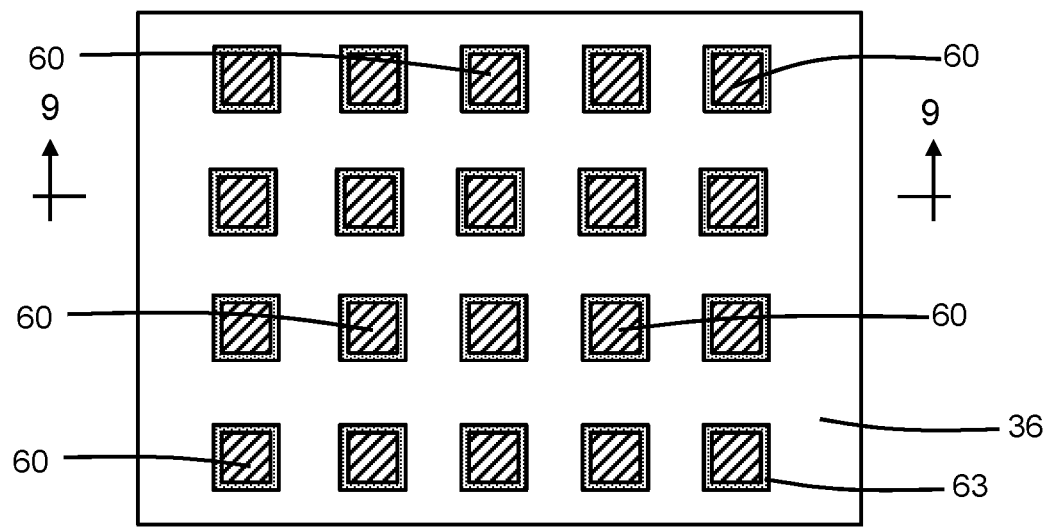
FIG. 9B is a diagrammatic top view of the structure of FIG. 9 in which overlying layers in the interconnect structure are omitted for clarity of description and in which the metal features are arranged in a two-dimensional array.

In an embodiment, the array may be one-dimensional with the metal features 60 having an elongate shape and a substantially parallel or parallel placement in a single row, as shown in FIG. 9A. In an embodiment, the array may be two-dimensional in which the metal features 60 are arranged in rows and columns, and have a more compact shape, as shown in FIG. 9B. In an alternative embodiment, the metal features 60 may be arranged in the interlayer dielectric layer 28 of the metallization level 44. In an alternative embodiment, a set of the metal features 60 may be present in both of the metallization levels 44, 46.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a semiconductor substrate;
    a waveguide core comprised of a dielectric material; and
    a back-end-of-line interconnect structure including a first cap layer, a first interlayer dielectric layer, and a first metal feature extending partially through the first interlayer dielectric layer, the first interlayer dielectric layer and the first cap layer positioned in a vertical direction relative to the waveguide core, and the first metal feature having a first overlapping arrangement in a lateral direction with the waveguide core,
    wherein a portion of the first interlayer dielectric layer is located between the first metal feature and the waveguide core, and the waveguide core is positioned in the vertical direction between the back-end-of-line interconnect structure and the semiconductor substrate.

2. The structure of claim 1 wherein the first metal feature is positioned in the vertical direction between the first cap layer and the semiconductor substrate.

3. The structure of claim 1 wherein the waveguide core is positioned in the vertical direction between the first metal feature and the semiconductor substrate.

4. The structure of claim 1 wherein the first cap layer is comprised of silicon carbon nitride.

5. The structure of claim 1 wherein the waveguide core includes a taper, and the first metal feature is arranged with the first overlapping arrangement over the taper.

6. The structure of claim 1 wherein the back-end-of-line interconnect structure includes a second cap layer, and the first interlayer dielectric layer is arranged in the vertical direction between the first cap layer and the second cap layer.

7. The structure of claim 6 wherein the back-end-of-line interconnect structure includes a second interlayer dielectric layer and a second metal feature embedded in the second interlayer dielectric layer, the second interlayer dielectric layer is arranged in the vertical direction between the waveguide core and the first cap layer, and the second metal feature has a second overlapping arrangement in the lateral direction with the waveguide core.

8. The structure of claim 1 wherein the back-end-of-line interconnect structure includes a second cap layer, and the first cap layer is stacked in the vertical direction between the first interlayer dielectric layer and the second cap layer.

9. The structure of claim 1 wherein the back-end-of-line interconnect structure includes a second metal feature and a third metal feature, and the first metal feature, the second metal feature, and the third metal feature are arranged in an array.

10. The structure of claim 9 wherein the array is one-dimensional arrangement of rows.

11. The structure of claim 9 wherein the array is two-dimensional arrangement of rows and columns.

12. The structure of claim 1 wherein the waveguide core includes a longitudinal axis and a first width transverse to the longitudinal axis, and the first metal feature has a second width that is greater than the first width of the waveguide core.

13. A method comprising:
    patterning a waveguide core from a dielectric layer;
    depositing a first interlayer dielectric layer of a back-end-of-line interconnect structure;
    patterning a trench extending partially through the first interlayer dielectric layer;
    depositing a metal in the trench to form a first metal feature; and
    depositing a first cap layer that is stacked in a vertical direction in the back-end-of-line interconnect structure with the first interlayer dielectric layer,
    wherein the first metal feature has a first overlapping arrangement in a lateral direction with the waveguide core, and a portion of the first interlayer dielectric layer is located between the first metal feature and the waveguide core.

14. The method of claim 13 wherein the first interlayer dielectric layer is arranged in the vertical direction between the first cap layer and the waveguide core.

15. The method of claim 13 wherein the first cap layer is arranged in the vertical direction between the first interlayer dielectric layer and the waveguide core.

16. The method of claim 13 further comprising:
    depositing a second cap layer of the back-end-of-line interconnect structure,
    wherein the first interlayer dielectric layer is arranged in the vertical direction between the first cap layer and the second cap layer.

17. The method of claim 16 wherein the back-end-of-line interconnect structure includes a second interlayer dielectric layer and a second metal feature embedded in the second interlayer dielectric layer, the second interlayer dielectric layer is arranged in the vertical direction between the waveguide core and the first cap layer, and the second metal feature has a second overlapping arrangement in the lateral direction with the waveguide core.

18. The structure of claim 1 further comprising:
    a barrier/liner layer arranged between the first metal feature and surfaces of the first interlayer dielectric layer around the first metal feature.

19. The structure of claim 1 wherein the first metal feature fully overlaps in the lateral direction with the waveguide core.

* * * * *